(12) United States Patent
Kato

(10) Patent No.: US 7,580,317 B2
(45) Date of Patent: Aug. 25, 2009

(54) SEMICONDUCTOR MEMORY DEVICE

(75) Inventor: Tatsuhiro Kato, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 11 days.

(21) Appl. No.: 12/002,755

(22) Filed: Dec. 19, 2007

(65) Prior Publication Data
US 2008/0159051 A1    Jul. 3, 2008

(30) Foreign Application Priority Data
Dec. 27, 2006   (JP) ............................. 2006-352484

(51) Int. Cl.
G11C 8/00 (2006.01)
(52) U.S. Cl. .................. 365/230.05; 365/154
(58) Field of Classification Search ........... 365/230.05, 365/154, 156
See application file for complete search history.

(56) References Cited

U.S. PATENT DOCUMENTS 5,477,489 A * 12/1995 Wiedmann ............. 365/189.04
6,430,083 B1 * 8/2002 Lu et al. ...................... 365/154
6,999,372 B2 * 2/2006 Takayanagi ............ 365/230.05
7,042,792 B2 * 5/2006 Lee et al. ............... 365/230.05

FOREIGN PATENT DOCUMENTS

JP        5-299621       11/1993
JP        2005-346837    12/2005

* cited by examiner

Primary Examiner—Anh Phung
(74) Attorney, Agent, or Firm—McGinn IP Law Group, PLLC

(57) ABSTRACT

A semiconductor memory circuit includes first and second bit lines making a first pair, third and fourth bit lines making a second pair, a memory cell having a first inverter coupled between the first pair, a second inverter coupled between the second pair, a third inverter coupled between first and third bit lines and a fourth inverter coupled between second and fourth bit lines. The memory cell further includes a first access switch inserted between first bit line and the first inverter, second access switch inserted between second bit line and the second inverter, third access switch inserted between third bit line and the third inverter and fourth access switch inserted between fourth bit line and the fourth inverter.

11 Claims, 8 Drawing Sheets

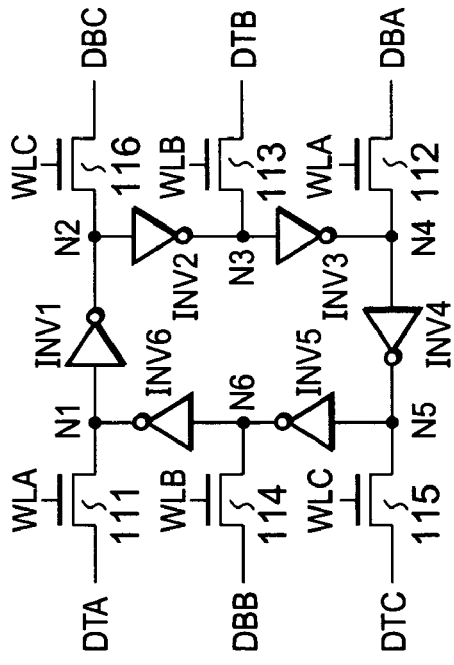
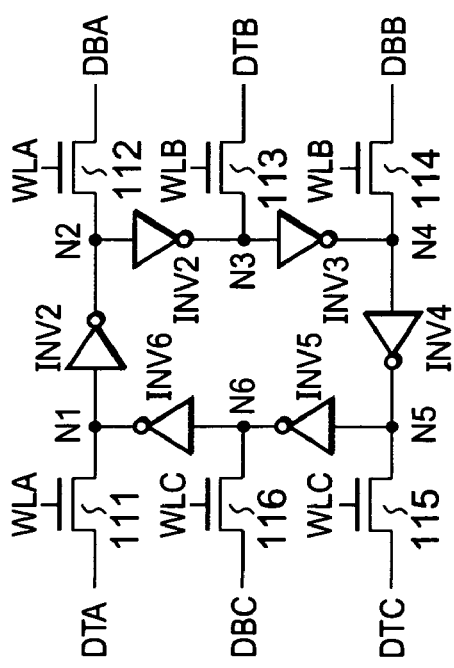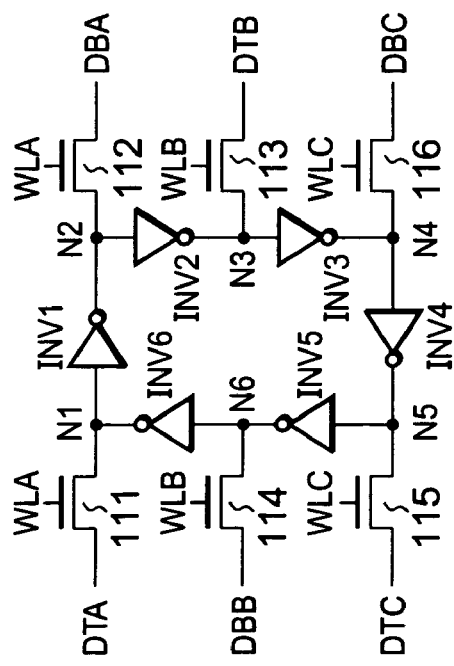

SEMICONDUCTOR MEMORY DEVICE

BACKGROUND OF THE INVENTION

1. Field of the Invention

The present invention relates to a semiconductor memory device, and more particularly, to a multi-port semiconductor memory device.

2. Description of Related Art

FIG. 5 is a schematic view for explaining a memory cell of a dual-port RAM having eight transistors per memory cell. With reference to FIG. 5, the memory cell includes inverters INV1 and INV2. The input of the inverter INV1 is connected to the output of the inverter INV2, while the output of the inverter INV1 is connected to the input of the inverter INV2. Additionally, the memory cell includes access transistors 111 and 112 for a port A and access transistors 113 and 114 for a port B between connection nodes N1 and N2 and bit lines DTA/DBA and DTB/DBB, respectively. This memory cell is a memory cell of an SRAM (a static RAM) which can be simultaneously accessed through the port A and the port B. When a word line WLA is activated, data write or data read from the bit line pair DTA and DBA can be carried out. When a word line WLB is activated, data write or data read from the bit line pair DTB and DBB can be carried out. Data stored in the memory cell is latched by the inverters INV1 and INV2. In order to store data in the memory cell through the port A when the voltage on the bit line DTA is high level and the voltage on the bit line DBA is low level, the word line WLA is activated and output voltages of the inverters INV1 and INV2 are the low level and the high level, respectively. After that, when the memory cell stores inverted data through the port A or through the port B, the two inverters invert the stored data. For example, when output voltage of the inverters INV1 and INV2 are the low level and the high level, respectively, and the word line WLA is activated and data expressed by the low level on DTA and the high level on DBA is written, output voltages of the inverters INV1 and INV2 are the high level and the low level, respectively.

FIG. 6 is a view for explaining a structure and operation of the memory cell of FIG. 5. FIG. 6 shows a PMOS transistor PM1 a source of which is connected to a power supply, an NMOS transistor NM1 a source of which is connected to GND and a drain of which is connected to a drain of the PMOS transistor PM1, a PMOS transistor PM2 a source of which is connected to the power supply, and an NMOS transistor NM2 a source of which is connected to GND and a drain of which is connected to a drain of the PMOS transistor PM2. A common gate of the PMOS transistor PM1 and the NMOS transistor NM1 is connected to a common drain of the PMOS transistor PM2 and the NMOS transistor NM2, while a common drain of the PMOS transistor PM1 and the NMOS transistor NM1 is connected to a common gate of the PMOS transistor PM2 and the NMOS transistor NM2. The common drain of the PMOS transistor PM1 and the NMOS transistor NM1 is connected to the bit lines DTA and DTB through access transistors 111 and 113 gates of which are connected to the word lines WLA and WLB, respectively. The common drain of the PMOS transistor PM2 and the NMOS transistor NM2 is connected to the bit lines DBA and DBB through access transistors 112 and 114 gates of which are connected to the word lines WLA and WLB, respectively.

FIG. 6 schematically illustrates a state where the word lines WLA and WLB are activated to be high, the access transistors 111-114 are turned on, and the bit lines DTA and DTB precharged to the high level is discharged through the NMOS transistor NM1. Cell currents Icell_A and Icell_B flow through the access transistor (port A access Tr) 111 and the access transistor (port B access Tr) 113, respectively, into the drain and ultimately into the source of the NMOS transistor NM1.

With regard to the structure of a dual-port RAM or a multi-port RAM, please also refer to, for example, Japanese Patent Application Laid-open No. Hei 5-299621 and Japanese Patent Application Laid-open No. 2005-346837. Japanese Patent Application Laid-open No. Hei 5-299621 discloses a dual-port RAM where, in order to increase the integration degree, the access transistors are formed of PMOS transistors. Japanese Patent Application Laid-open No. 2005-346837 discloses a dual-port RAM where, in reading operation, when it is detected that row addresses of first and second ports match each other, only a word line of the first port is activated, a column switch connects a bit line pair of the first port selected according to a column address of the first port to a data line pair of the first port and connects a bit line pair of the first port selected according to a column address of the second port to a data line pair of the second port.

The present inventor has recognized that, in the dual-port RAM of FIG. 5, when simultaneous access where word lines WLA and WLB are simultaneously activated is made, bit line potential changes at a lower speed than that in a case where access is made only through one of the ports. Then the access time is increased or malfunction is caused. The following is a study made by the present inventor.

In the dual-port RAM of FIGS. 5 and 6, both of the access transistors provided correspondingly to the bit lines of the two ports, respectively, are connected to an output of one inverter. Therefore, when the word lines WLA and WLB are simultaneously activated, current flowing through one access transistor is decreased. Further, depending on variations in current driving ability of the access transistors or the like, the amount of current flowing through an access transistor is, for example, on the order of ⅓ to 1/10 of that when simultaneous access is not made. Therefore, amplitude of the bit line potential when the port A and the port B are simultaneously accessed is decreased.

Further, with the progress of miniaturization of semiconductor devices, random variations in the cell currents Icell_A and Icell_B of the port A and the port B in one memory cell increases accordingly. FIG. 7B illustrates an equivalent circuit of FIG. 7A including access transistors 111 and 113 and an NMOS transistor NM1.

In FIG. 7A, variations in the cell currents Icell_A and Icell_B is variations in currents IAccA and IAccB in the equivalent circuit in FIG. 7B. RAccA and RAccB are on-resistances of the access transistors of the port A and the port B, and RDRV is on-resistance of the NMOS transistor NM1 (driver transistor) of an inverter in the memory cell.

IAccA+IAccB=IDRV, and therefore, when the current IAccA flowing through one access transistor increases, the current IAccB flowing through the other access transistor decreases. This current difference causes the difference in discharging rate of the bit lines. More specifically, variations in the cell currents Icell_A and Icell_B are found to be variations in discharge ability based on current driving ability of the access transistors. When the difference in discharging rate is remarkable, potential difference between a pair of bit lines of one port is decreased, which may cause malfunction. In order to prevent such malfunction, it is necessary to enhance current driving ability of the driver transistor. However, enhancing the current driving ability of the driver transistor increases the memory cell area.

FIG. 8 is a waveform chart schematically illustrating relationship between presence and absence of variations in the access transistors of the port A and the port B and data on the bit lines. Variations in current driving ability of the access transistors drastically decrease current flowing through the access transistor with the lower current driving ability. Therefore, potential difference between a bit line pair (in FIG. 8, the bit line pair DTA/DBA) is decreased.

As a result, there is a problem that variations in access transistors between ports decrease potential difference between a bit line pair, which causes unstable operation of a sense amplifier to cause false sensing.

SUMMARY

The present invention seeks to solve one or more of the above problems, or to improve upon those problems at least in part.

In one embodiment of the present invention, a semiconductor memory circuit includes a plurality of bit line pairs, a plurality of memory cells connected between each of the bit line pairs, each of the memory cells being accessible by the bit line pairs from a plurality of ports. Each of the memory cells includes a plurality of access transistors and a latch circuit. The access transistors each connected to an associated one bit line of the bit line pairs. The latch circuit has a plurality of inverter circuits which are connected in ring shape. Each of the inverter circuits includes an output terminal which is connected to an associated one of the access transistors.

As described above, because one access transistor is connected to one driver transistor of the inverter circuit, even when there are variations in access transistors between ports, compared with a case where a plurality of access transistors share one driver transistor, extreme decrease in current flowing through the respective access transistors is not caused even when the word lines WLA and WLB are simultaneously activated. Therefore, a sense amplifier of a semiconductor memory having the memory cell operates stably and false sensing can be avoided.

In another embodiment of the present invention, a semiconductor memory circuit comprises first and second bit lines making a first pair, third and fourth bit lines making a second pair, a first inverter coupled between the first and second bit lines, a second inverter coupled between the third and fourth bit lines, a third inverter coupled between the first and third bit lines, and a fourth inverter coupled between the second and fourth bit lines.

In the other embodiment of the present invention, a semiconductor memory circuit comprises first and second bit lines making a first pair, third and fourth bit lines making a second pair, and a memory cell having first, second, third and fourth nodes, the first node being the same in logic level as the third node, the second node being the same in logic level as the fourth node and different in logic level from the first node, the first bit line being operatively coupled to the first node of the memory cell, the second bit line being operatively coupled to the second node of the memory cell, the third bit line being operatively coupled to the third node of the memory cell, and the fourth bit line being operatively coupled to the fourth node of the memory cell.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 4A to 4C illustrate structures of memory cells according to other embodiments of the present invention;

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Figure 1:
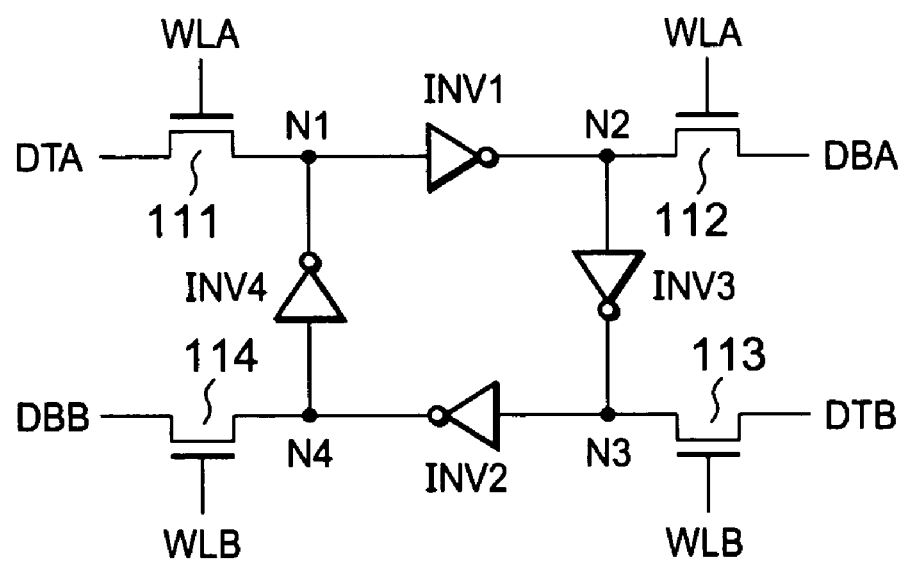
FIG. 1 illustrates a structure of a memory cell according to an embodiment of the present invention.

Referring now to FIG. 1, a memory cell according to a first embodiment of the present invention includes access transistors 111 to 114, and the inverters INV3 and INV4 in addition to the inverters INV1 and INV2. The access transistor (access switch) 111 has a source-drain path connected between a bit line DTA and output of the inverter INV1 and a gate connected to a word line WLA. The access transistor (access switch) 112 has a source-drain path connected between a bit line DBA and output of the inverter INV2 and a gate connected to the word line WLA. The access transistor (access switch) 113 has a source-drain path connected between a bit line DTB and output of the inverter INV3 and a gate connected to a word line WLB. The access transistor (access switch) 114 has a source-drain path connected between a bit line DBB and output of the inverter INV4 and a gate connected to the word line WLB. The inverter INV1 has an input connected to a node N1 and an output connected to a node N2. The inverter INV2 has an input connected to a node N3 and an output connected to a node N4. The inverter INV3 has an input connected to a node N2 and an output connected to a node N3. The inverter INV4 has an input connected to a node N4 and an output connected to a node N1. The memory cell according to the present invention of FIG. 1 is an SRAM memory cell which has two ports and which can be simultaneously accessed through the two ports.

In the memory cell of FIG. 1, when the word line WLA is activated, the access transistors 111 and 112 are turned on, and data write or data read is carried out through the bit line pair DTA and DBA. On the other hand, when the word line WLB is activated, the access transistors 113 and 114 are turned on, and data write or data read is carried out through the bit line pair DTB and DBB.

Data written in the memory cell is latched by the inverters INV1, INV2, INV3, and INV4 in cascade connection (in a ring shape). When inverted data of the latched data is written through any one of the ports, outputs of the four inverters are inverted, respectively, and the held data is inverted. For example, when the node N1 is at the high level, the nodes N2, N3, and N4 are at the low level, at the high level, and at the low level, respectively. In this case, when data at the low level is written in the node N1, the nodes N2, N3, and N4 are changed to be at the high level, at the low level, and at the high level, respectively. When data at the high level is written in the node N2, the nodes N3, N4, and N1 are changed to be at the low level, at the high level, and at the low level, respectively.

In this embodiment mode of FIG. 1, even when the word lines WLA and WLB are simultaneously activated and simultaneous access is made, the rate at which bit line potential changes is not lower than that in a case where access is made only through one of the ports. Because output of one inverter is connected to an access transistor provided correspondingly to one bit line, and thus, current through each access transistor is not decreased.

When the word lines WLA and WLB are simultaneously activated with the input and the output of the inverter INV4 being at the high level and at the low level, respectively, drive current from the inverter INV4 (discharge current to GND) flows through the access transistor 111 to the bit line DTA. On the other hand, drive current from the inverter INV3 (discharge current to GND) flows through the access transistor 113 to the bit line DTB. In this case, since the outputs of the inverters INV2 and INV4 are at the high level, the bit lines DBA and DBB are held at the high level which is precharge potential. Embodiments are described in the following.

Figure 2:
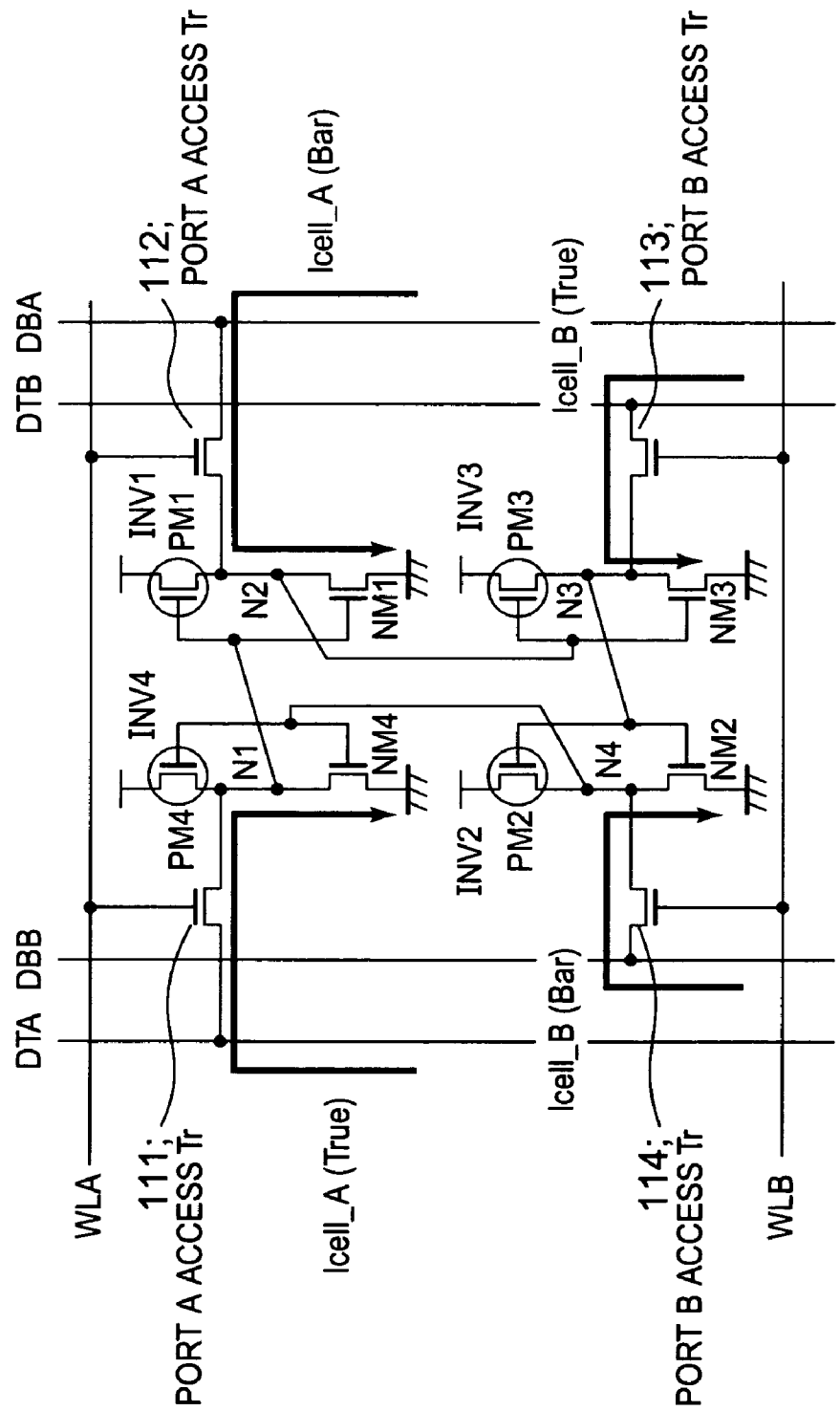
FIG. 2 is a view for explaining a structure and operation of the memory cell according to the embodiment of the present invention.

FIG. 2 illustrates an embodiment of a structure of the memory cell according to the present invention of FIG. 1. The SRAM memory cell of FIG. 2 has the four inverters INV1 to INV4. The inverter INV1 has a PMOS transistor PM1 and an NMOS transistor NM1 connected in series between a power supply and GND. A gate of the PMOS transistor PM1 and a gate of the NMOS transistor NM1 are commonly connected to the node N1, and a connection point between a drain of the PMOS transistor PM1 and a drain of the NMOS transistor NM1 is the node N2.

Similarly, the inverter INV2 has a PMOS transistor PM2 and an NMOS transistor NM2 which are connected in series between a power supply and GND. A gate of the PMOS transistor PM2 and a gate of the NMOS transistor NM2 are commonly connected to the node N3, and a connection point between a drain of the PMOS transistor PM2 and a drain of the NMOS transistor NM2 is the node N4.

The inverter INV3 has a PMOS transistor PM3 and an NMOS transistor NM3 which are connected in series between a power supply and GND. A gate of the PMOS transistor PM3 and a gate of the NMOS transistor NM3 are commonly connected to the node N2, and a connection point between a drain of the PMOS transistor PM3 and a drain of the NMOS transistor NM3 is the node N3.

The inverter INV4 has a PMOS transistor PM4 and an NMOS transistor NM4 which are connected in series between a power supply and GND. A gate of the PMOS transistor PM4 and a gate of the NMOS transistor NM4 are commonly connected to the node N4, and a connection point between a drain of the PMOS transistor PM4 and a drain of the NMOS transistor NM4 is the node N1.

In this embodiment, one driver transistor is connected to one access transistor of one port. In other words, one driver transistor is not shared by a plurality of access transistors. Therefore, even when the word lines WLA and WLB are simultaneously activated, current flowing through an access transistor of one port is not affected by an access transistor of the other port. Further, potential difference between a bit line pair is not narrowed compared with a case where a plurality of access transistors shares one driver transistor. Therefore, false sensing can be avoided.

In FIG. 2, discharge paths of cell current Icell_A (True) and Icell_B (True) are illustrated. The bit lines DTA and DTB are discharged by the NMOS transistors NM4 and NM3 of the inverters INV4 and INV3 through the access transistors 111 and 113, respectively. In FIG. 2, discharge paths of cell current Icell_A (Bar) and Icell_B (Bar) are also illustrated. The bit lines DBA and DBB are discharged by the NMOS transistors NM1 and NM2 of the inverters INV1 and INV2 through the access transistors 112 and 114, respectively. In FIG. 2, when the word lines WLA and WLB are simultaneously activated, based on data held by the memory cell, cell current flows through any one of the pairs of Icell_A (True) and Icell_B (True) and of Icell_A (Bar) and Icell_B (Bar). It is to be noted that the bit line pair DTA and DBA and the bit line pair DTB and DBB are precharged, for example, before reading/writing operation to precharge potential (high level). In reading operation, one of precharged bit line pairs is discharged by the driver transistors (NM1, NM2, NM3, and NM4 of FIG. 2) of the inverters, based on data held by the memory cell.

Figure 3:
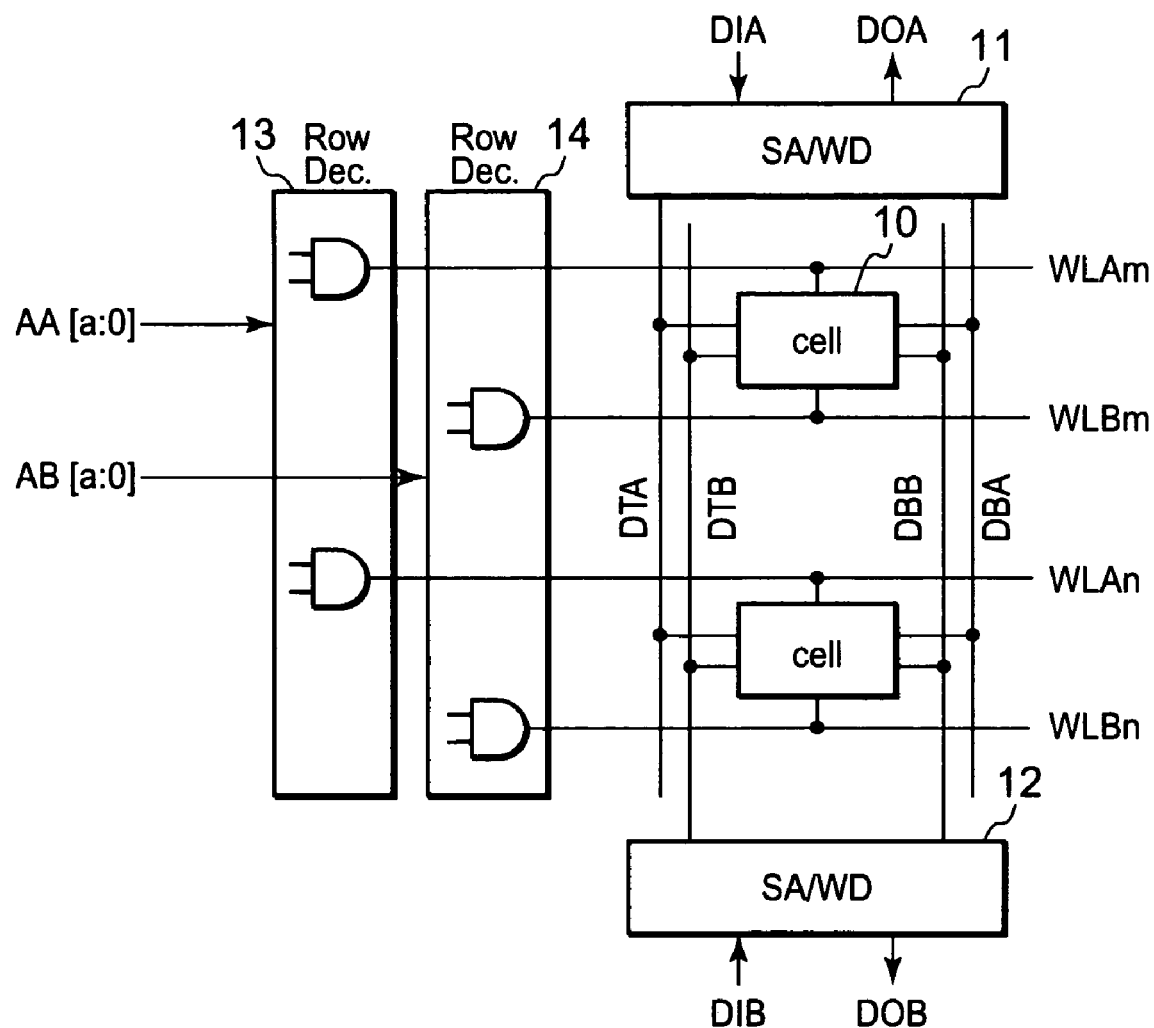
FIG. 3 illustrates a structure of a memory cell array according to the embodiment of the present invention.
Figure 5:
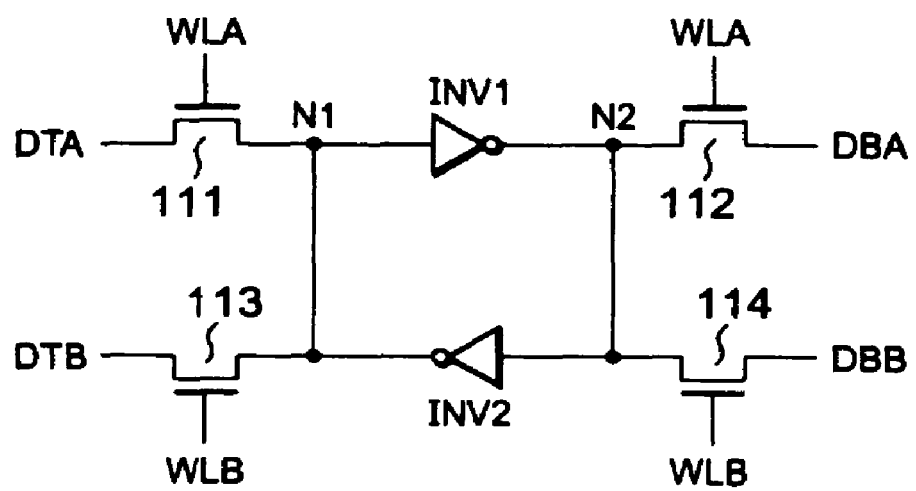
FIG. 5 illustrates a typical structure of a cell of a dual-port RAM.
Figure 6:
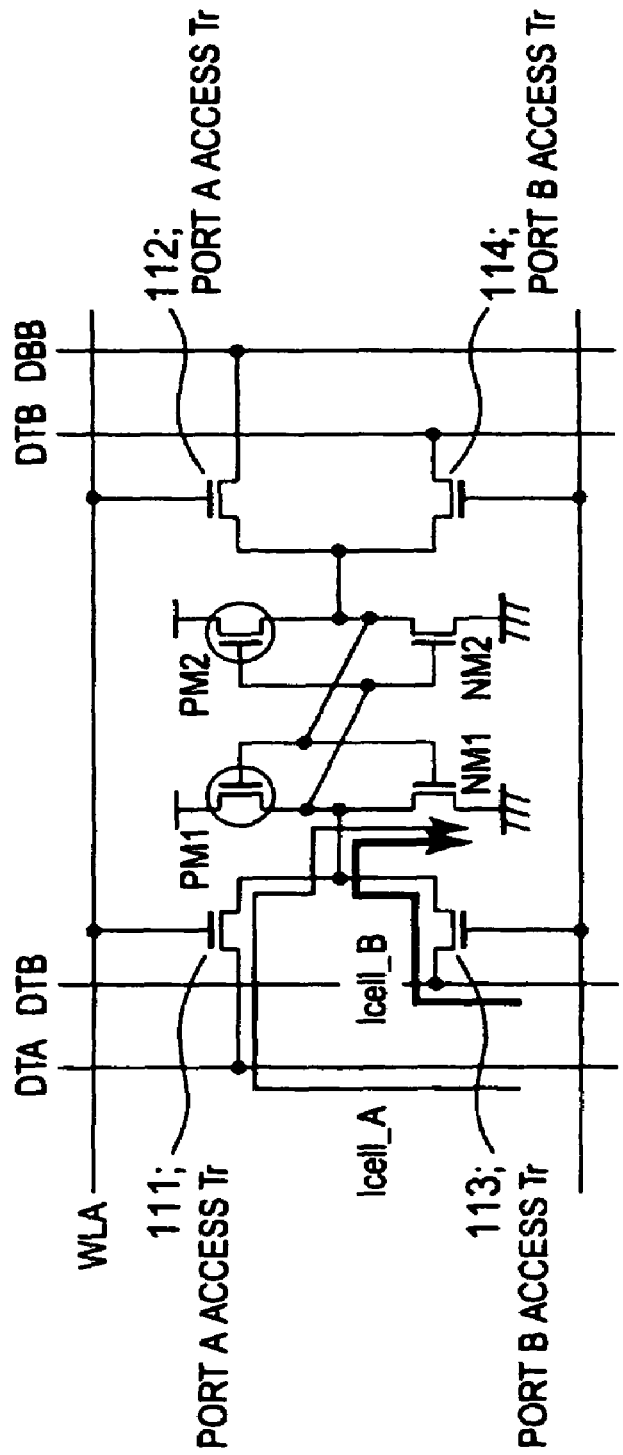
FIG. 6 illustrates an operation of the dual-port RAM of FIG. 5.
Figure 7B:
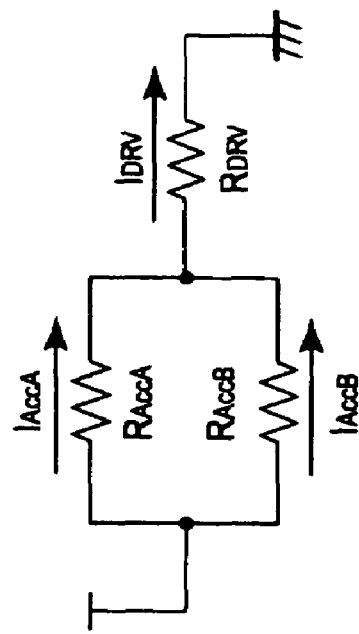
FIG. 7B is an equivalent circuit of FIG. 7A.
Figure 7A:
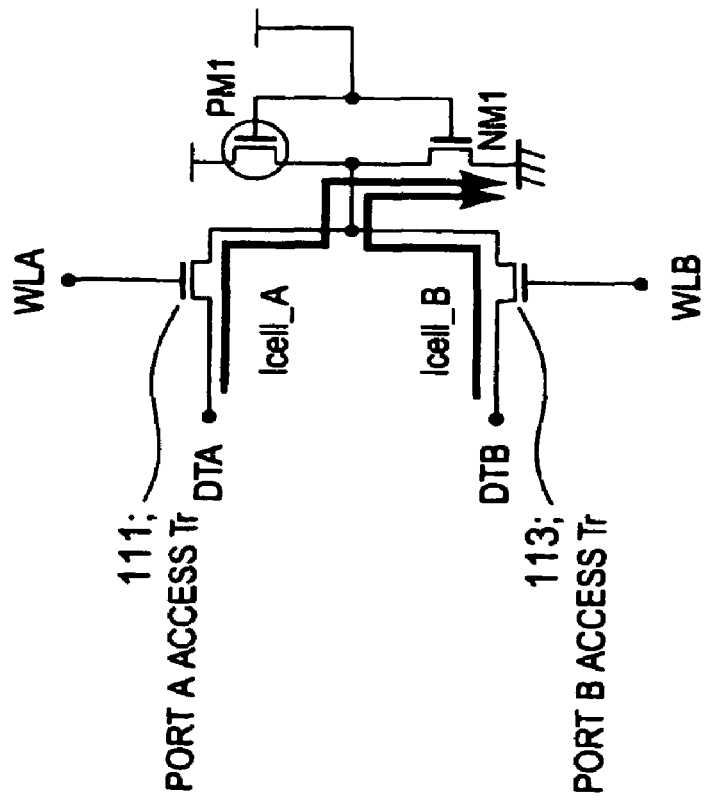
FIG. 7A illustrates current paths through access transistors of the dual-port RAM.
Figure 8:
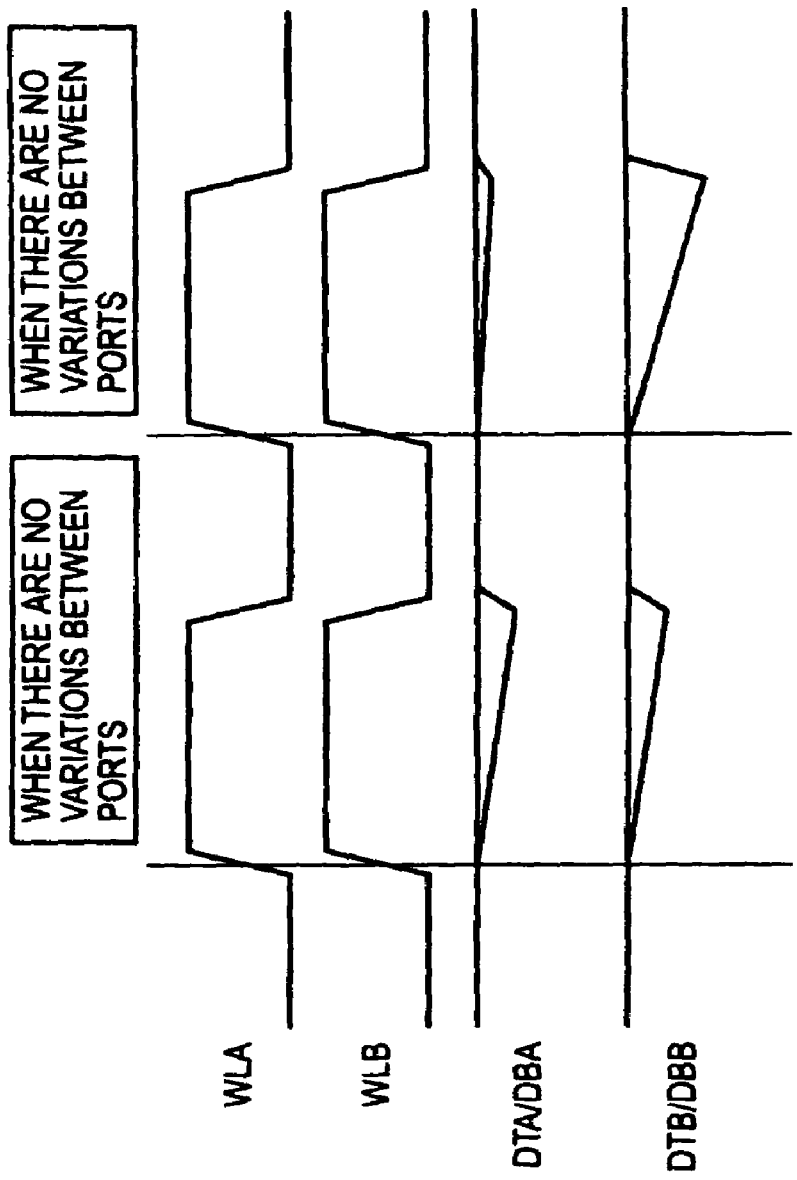
FIG. 8 is a waveform chart illustrating relationship between presence and absence of variations in current driving ability of the access transistors and data on bit lines.

FIG. 3 illustrates a structure of a memory cell array having the memory cell of this embodiment. The memory cell array has memory cells 10 which are equivalent to the memory cell of FIGS. 1 and 2, a sense amplifier (SA)/writing driver (WD) 11 for a port A connected to the bit line pair DTA and DBA, a sense amplifier (SA)/writing driver (WD) 12 for a port B connected to the bit line pair DTB and DBB, a row decoder 13 for the port A for selectively driving the word line WLA of the port A, and a row decoder 14 for the port B for selectively driving the word line WLB of the port B. The sense amplifier (SA)/writing driver (WD) 11 for the port A inputs/outputs data DIA/DOA of the port A while the sense amplifier (SA)/writing driver (WD) 12 for the port B inputs/outputs data DIB/DOB of the port B.

The above description is with regard to a 2-port RAM, but the present invention is not limited thereto, and applicable to multi-port RAMs having an arbitrary number of ports.

FIGS. 4A, 4B, and 4C illustrate exemplary structures of memory cells of 3-port RAMs as other embodiments. The 3-port RAM of FIG. 4A is a memory cell having 18 transistors. Two inverters and two access transistors are provided for each port.

The memory cell of FIG. 4A has access transistors 111, 112, 113, 114, 115, and 116 one ends of which are connected to bit lines DTA, DBA, DTB, DBB, DTC, and DBC and the other ends of which are connected to nodes N1, N2, N3, N4, N5, and N6, respectively, an inverter INV1 an input and an output of which are connected to the nodes N1 and N2, respectively, an inverter INV2 an input and an output of which are connected to the nodes N2 and N3, respectively, an inverter INV3 an input and an output of which are connected to the nodes N3 and N4, respectively, an inverter INV4 an input and an output of which are connected to the nodes N4 and N5, respectively, an inverter INV5 an input and an output of which are connected to the nodes N5 and N6, respectively, and an inverter INV6 an input and an output of which are connected to the nodes N6 and N1, respectively.

FIGS. 4B and 4C illustrate variations of a memory cell of a 3-port RAM. The memory cells of FIGS. 4B and 4C have combinations of connections of access transistors and bit lines connected to access transistors, the combinations being different from that in the memory cell of FIG. 4A. The memory cells are similar to the memory cell of FIG. 4A in that one inverter is connected to one access transistor.

A memory cell having four or more ports may also be formed in a similar way such that each port has two inverters and two access transistors. In other words, what is necessary is that an output of one inverter is connected to one access transistor.

It is apparent that the present invention is not limited to the above embodiments, but may be modified and changed without departing from the scope and spirit of the invention.

What is claimed is:

1. A semiconductor memory circuit comprising a plurality of bit line pairs, a plurality of memory cells connected between each of said bit line pairs, each of said memory cells being accessible by said bit line pairs from a plurality of ports, wherein each of said memory cells comprises:
   a plurality of access switches each connected to an associated one bit line of said bit line pair; and
   a latch circuit having a plurality of inverter circuits, said inverter circuits connected in ring shape and each having an output terminal, said output terminals connected to different bit lines from each other through associated one of said access switches.

2. The semiconductor memory circuit as claimed in claim 1, wherein each of said memory cells is accessible from N-ports where N is integer over 2 and includes 2N access transistors, and said latch circuit has 2N inverter circuits.

3. The semiconductor memory circuit as claimed in claim 1, wherein each of said bit line pair includes a bit line true and a bit line bar, said bit line true and said bit line bar are connected to different inverter circuits from each other through associated one of said access switches so that the signal on the bit line bar becomes inversion signal of signal on bit line true.

4. A semiconductor memory circuit comprising:
   first and second bit lines making a first pair;
   third and fourth bit lines making a second pair;
   a first inverter coupled between the first and second bit lines;
   a second inverter coupled between the third and fourth bit lines;
   a third inverter coupled between the first and third bit lines; and
   a fourth inverter coupled between the second and fourth bit lines.

5. The semiconductor memory circuit as claimed in claim 4, further comprising a first access switch inserted between the first bit line and the first inverter, a second access switch inserted between the second bit line and the second inverter, a third access switch inserted between the third bit line and the third inverter, and a fourth access switch inserted between the fourth bit line and the fourth inverter.

6. The semiconductor memory circuit as claimed in claim 4, further comprising:
   fifth and sixth bit lines making a third pair; and
   fifth and sixth inverters inserted between the first and third bit lines,
   wherein the fifth inverter coupled between the fifth and sixth bit lines, the sixth inverter coupled between the sixth and first bit lines and the third inverter coupled between the third and fifth bit lines.

7. The semiconductor memory circuit as claimed in claim 6, further comprising:
   a fifth access switch inserted between the fifth bit line and the fifth inverter; and
   a sixth access switch inserted between the sixth bit line and the sixth inverter.

8. A semiconductor memory circuit comprising:
   first and second bit lines making a first pair;
   third and fourth bit lines making a second pair; and
   a memory cell having first, second, third and fourth nodes, the first node being the same in logic level as the third node, the second node being the same in logic level as the fourth node and different in logic level from the first node, the first bit line being operatively coupled to the first node of the memory cell, the second bit line being operatively coupled to the second node of the memory cell, the third bit line being operatively coupled to the third node of the memory cell, and the fourth bit line being operatively coupled to the fourth node of the memory cell.

9. The semiconductor memory circuit as claimed in claim 8, further comprising:
   a first access switch inserted between the first bit line and first node of the memory cell and rendered conductive in response to a first control signal to operatively couple the first bit line and the first node of the memory cell;
   a second access switch inserted between the second bit line and second node of the memory cell and rendered conductive in response to the first control signal to operatively coupled the second bit line and the second node of the memory cell;
   a third access switch inserted between the third bit line and third node of the memory cell and rendered conductive in response to a second control signal to operatively couple the third bit line and the third node of the memory cell; and
   a fourth access switch inserted between the fourth bit line and fourth node of the memory cell and rendered conductive in response to the second control signal to operatively couple the fourth bit line and the fourth node of the memory cell.

10. The semiconductor memory circuit as claimed in claim 8, further comprising:
    fifth and sixth bit lines making a third pair; and
    the memory cell further having fifth and sixth nodes, the fifth node being the same in logic level as the first node, the sixth node is the same in logic level as the second node, the fifth bit line is operatively coupled to the fifth node of the memory cell, and the sixth bit line is operatively coupled to the sixth node of the memory cell.

11. The semiconductor memory circuit as claimed in claim 10, further comprising:
    a fifth access switch inserted between the fifth bit line and the fifth node of the memory cell and rendered conductive in response to a third control signal to operatively couple the fifth bit line and the fifth node of the memory cell; and
    a sixth access switch inserted between the sixth bit line and the sixth node of the memory cell and rendered conductive in response to the third control signal to operatively couple the sixth bit line and the sixth node of the memory cell.

* * * * *